(12) United States Patent  
Duesman et al.

(10) Patent No.: US 6,713,788 B2
(45) Date of Patent: Mar. 30, 2004

(54) OPTO-ELECTRIC MOUNTING APPARATUS

(75) Inventors: Kevin G. Duesman, Boise, ID (US); Warren M. Farnworth, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/341,451

(22) Filed: Jan. 14, 2003

(65) Prior Publication Data

US 2003/0138989 A1 Jul. 24, 2003

Related U.S. Application Data

(60) Continuation-in-part of application No. 09/525,017, filed on Mar. 14, 2000, now Pat. No. 6,514,787, which is a division of application No. 09/049,940, filed on Mar. 20, 1998, now Pat. No. 6,380,563.

(51) Int. Cl.[7] .............................................. H01L 33/00
(52) U.S. Cl. ...................... 257/98; 257/99; 257/432; 257/433; 257/27; 257/28; 257/64; 257/65
(58) Field of Search ....................... 257/98, 99, 432, 257/433, 434, 777, 778; 438/25, 26, 27, 28, 64, 65, 66, 67, 116

(56) References Cited

U.S. PATENT DOCUMENTS

| 4,039,833 A | 8/1977 | Thom |
| 4,122,479 A | 10/1978 | Sugawara et al. |
| 4,660,066 A | 4/1987 | Reid |
| 4,752,816 A | 6/1988 | Sussman et al. |
| 4,818,728 A | 4/1989 | Rai et al. |
| 5,170,451 A | 12/1992 | Ohshima |
| 5,265,177 A | 11/1993 | Cho et al. |
| 5,394,490 A | * 2/1995 | Kato et al. .................. 257/778 |
| 5,515,468 A | 5/1996 | DeAndrea et al. |
| 5,523,628 A | * 6/1996 | Williams et al. ............. 257/777 |
| 5,545,893 A | 8/1996 | Brown et al. |
| 5,574,814 A | 11/1996 | Noddings et al. |
| 5,586,207 A | 12/1996 | Goodwin |
| 5,591,959 A | * 1/1997 | Cigna et al. ................. 257/777 |
| 5,675,685 A | 10/1997 | Fukuda et al. |
| 5,686,317 A | 11/1997 | Akram et al. |
| 5,686,318 A | 11/1997 | Farnworth et al. |
| 5,687,267 A | 11/1997 | Uchida |
| 5,689,279 A | 11/1997 | Nelson et al. |
| 5,692,083 A | 11/1997 | Bennett |
| 5,699,073 A | 12/1997 | Lebby et al. |
| 5,703,394 A | 12/1997 | Wei et al. |
| 5,708,280 A | 1/1998 | Lebby et al. |
| 5,764,832 A | * 6/1998 | Tabuchi ....................... 385/14 |
| 5,923,091 A | * 7/1999 | Nagai .......................... 257/777 |
| 6,217,232 B1 | * 4/2001 | Duesman et al. ............. 385/14 |

* cited by examiner

Primary Examiner—Kevin M. Picardat
(74) Attorney, Agent, or Firm—Dickstein Shapiro Morin & Oshinsky LLP

(57) ABSTRACT

An integrated circuit is provided with one or more connectors which allow an opto-electric device to be mounted on the integrated circuit directly on top of or underneath of it. Multiple opto-electric device interface regions can be defined on the integrated circuit such that an opto-electric device can be connected in a variety of directions or such that multiple opto-electric devices can be connected. In addition, an opto-electric device interface may be provided that causes the opto-electric device's leads to be directed to the corresponding integrated circuit lead in the shortest possible distance regardless of how the opto-electric device is positioned. Also disclosed is a substrate-mounted optical transmission system that may be used in connection with the opto-electric device.

33 Claims, 6 Drawing Sheets

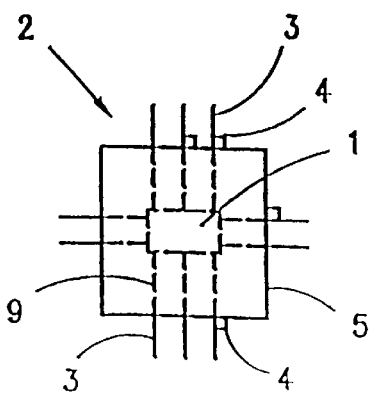
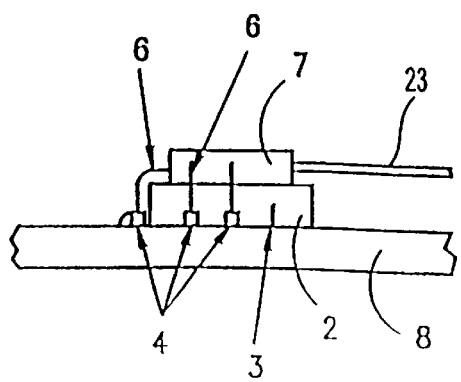
FIG. 1　　　　　FIG. 2
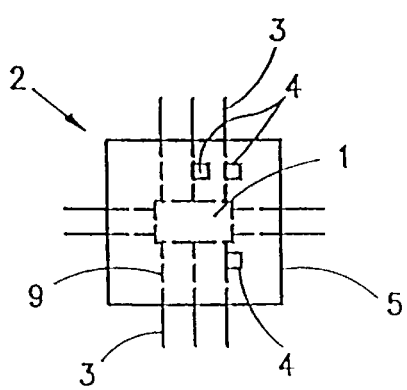
FIG. 3
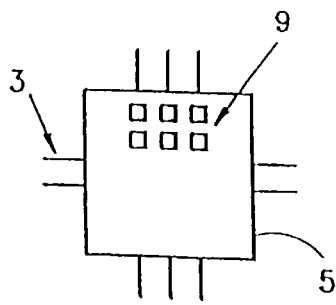
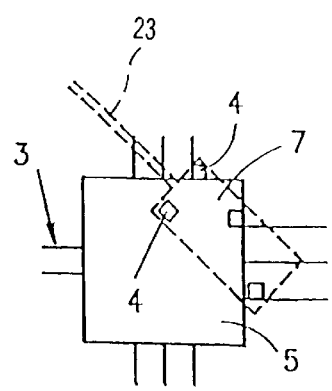
FIG. 4　　　　　FIG. 5

OPTO-ELECTRIC MOUNTING APPARATUS

This application is a continuation-in-part of application Ser. No. 09/525,017 filed Mar. 14, 2000, now U.S. Pat. No. 6,514,787, which is a divisional of application Ser. No. 09/049,940 filed Mar. 30, 1998, now U.S. Pat. No. 6,380,563 the contents of both being incorporated herein by reference.

BACKGROUND

1. Field of the Invention

The present invention relates to the attachment of an optical coupler to a circuit board and, more specifically to the piggy back attachment of an optical coupler to another component, such as an integrated circuitry (IC) mounted on a circuit board.

2. Discussion of the Related Art

Conventional data buses made from parallel wire technology are used pervasively in electronic circuitry intraframe and interframe interconnects. Wire does have its practical limits however. With high speed complex signal processing integrated circuits, the wire is limited to 10–20 meters for reliable error free data transmission. Moreover, as the speed of signal processing increases and integrated circuits act even faster, wire technology can add undesired delays. Optical technology is being increasingly used to overcome these constraints.

Fiber optic transmission lines (also referenced to as fiber optic cable) have several advantages over wire, including an often lower power requirement and an enhanced rate of reliable data transfer.

In a typical application, fiber optic connectors require a coupling device to optically couple the fiber optic transmission line with an opto-electric device (OED). The opto-electric device is generally electrically coupled to a driving circuit or other signal processing circuitry. This circuitry is conventionally mounted on a printed circuit board or ceramic substrate and is connected to the opto-electric device through the use of electronic pathways on the circuit board or substrate.

This general mounting system suffers from a number of problems however. First, the increased data transmission characteristics of the fiber optics cannot be taken full advantage of because the data must first pass from a signal processor such as a microprocessor, memory, driver integrated circuit, or other integrated circuit devices, to the opto-electric device through conventional electrical wiring connections formed on the substrate. Transmission rates are thus inherently slowed by the location of the opto-electric device on the substrate. The delay associated with this type of connection varies depending on the substrate design layout. Second, the use of electrical wiring paths increases the chance that EMF and other electrical noise will be introduced into the signal. Third, the placement of the opto-electric device on the substrate, and goal of minimizing bending of the fiber optics, limits board design.

SUMMARY OF THE INVENTION

The present invention overcomes these past problems by mounting an opto-electric device directly on top of, or below, an integrated circuit which is electrically connected to the opto-electric device. The opto-electric device is mounted directly to leads, or bonding pads, of the integrated circuit such that a minimum electrical path exists for transferring information between the integrated circuit and opto-electric device. Thus, the delay associated with the electrical wiring is minimized and unified for given IC/OED combinations, regardless of substrate design.

The integrated circuit is provided with connectors. These connectors can either be formed into the leads, replace a lead, or be attached to a conventional lead. The connectors can be a bonding pad or pin type receiving surface at the integrated circuit. Those of ordinary skill in the art will recognize that this can include any form of connector surface for enabling a bond between two electric conductors. The connector allows the opto-electric device to be mounted on top of the integrated circuit with respect to the substrate or below the substrate underneath the integrated circuit. In mounting the opto-electric device on the integrated circuit in a piggy back or in an opposite side of the substrate arrangement the full capabilities of the opto-electric device can be utilized while interference is reduced, transmission rates maximized and electric wiring pathway delay minimized and unified for given IC/OED packages.

In another embodiment, the opto-electric device can be either hermetically sealed or non-hermetically sealed with the integrated circuit inside a common package. The package, which can be made from a ceramic or resin, can be provided with a heat sink formed therein.

In another embodiment, two or more opto-electric devices can be mounted on an integrated circuit either in the same plane or one on top and one below the integrated circuit, or piggy backed on top of each other on the integrated circuit.

In another embodiment structural support or locating pins are molded into the integrated circuit. These structural supports or locating pins reduce the strain on the opto-electric device and assist in the mounting process.

In another embodiment, an opto-electric device interface adapter is connected to the integrated circuit such that any opto-electric device, or high transmission rate device, regardless of pin configuration can be attached thereto. The opto-electric device interface is provided with grounded and matched impedance sides that abut the integrated circuit and opto-electric device. The opto-electric device interface adapter can permit multiple opto-electric devices to be connected in a variety of positions. The opto-electric device interface adapter can also have a heat sink formed either between the opto-electric device and integrated circuit, on the opto-electric device or to the side. This permits heat buildup to be dissipated so as not to adversely effect the operations of the integrated circuit or the opto-electric device.

In another embodiment, a substrate upon which the opto-electric device is mounted contains an emission device, a fiber channel and a photo receptor for transmitting an optical signal, based on the electrical signal passed by the opto-electric device, to another portion of the substrate.

As the term is used herein, "OED" or "opto-electric device" refers to a device which converts electrical current to light and/or light to electric current. Those of ordinary skill in the art will recognize that many forms of opto-electric devices exist and that other high transmission rate transmitting/receiving devices that do not use fiber optics, but which use signaling paths which exceed the speed of conventional bus technology, can be substituted for the opto-electric device. The term "light" refers generally to electromagnetic radiation, and preferably those wavelengths of the electromagnetic radiation to which a sensing material surface or semi-conductive material is, or can be made, sensitive, whether or not such light is actually visible to the human eye. Non-limiting examples of opto-electric devices include lasers (for example double channel, planar buried heterostructure (DC-PHB), buried crescent (BC), distributed feedback (DFB), distributed Bragg reflector (DBR), etc.), light emitting diodes (LEDs) (for example, surface emitting LED (SLED), edge emitting LED (ELED), super luminescent diode (SLD), etc.) or photodiodes (P intrinsic, N, referencing the layout of the semiconductor (PIN), avalanche photodiode (APD), etc.).

Those of ordinary skill in the art will appreciate that the specific structure of the opto-electric device does not matter nor does the specific structure of the integrated circuit matter. Rather, the present invention is directed to a novel manner by which an opto-electric device is connected to an integrated circuit to reduce the wiring path between them.

These and other advantages and features of the invention will become more clearly apparent from the following detailed description of the invention, which is provided in connection with the several drawings attached hereto.

BRIEF DESCRIPTION OF THE DRAWINGS

FIG. 1 is a plan view of an integrated circuit with connectors on the radial periphery;

FIG. 2 is a side view of an opto-electric device mounted on an integrated circuit;

FIG. 3 is a plan view of an integrated circuit with top mounted connectors;

FIG. 4 is a plan view of an integrated circuit with top mounted connectors defining an opto-electric device interface region;

FIG. 5 is a plan view of an opto-electric device mounted on an integrated circuit;

DETAILED DESCRIPTION OF PREFERRED EMBODIMENTS

Figure 6:
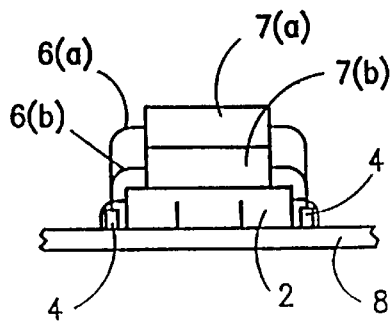
FIG. 6 is a side view of two opto-electric devices mounted one on top of the other.

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

As shown in FIGS. 1 and 2 an integrated circuit 2, which those of ordinary skill in the art will understand can include a microprocessor, memory, opto-electric driver/receiver or any other type of electronic circuit 1, is attached to a substrate connector for electrical connection with a wiring pattern on substrate 8. Integrated circuit 2 may include, but is not limited to using a PGA, BGA, straight leg, Gullwing or J Lead terminals for connection to the substrate 8. Integrated circuit 2 is attached to the substrate through its leads 3 extending outside of its encapsulation/packaging 5. The integrated circuit leads 3 provide the electrical connection between the integrated circuit 2 and electrical wiring on substrate 8.

At least one lead 3 is provided with a connector 4 of sufficient dimensions to form a bonding surface for a lead from an opto-electric device 7. In most applications several connectors 4 will be provided, at least one for power, at least one for ground and others as needed for data transmission/reception to and from opto-electric device 7. The number and placement of connectors 4 depend on the opto-electric device 7 being used and its relative placement. For example, as shown in FIGS. 3 and 4, the lead frame 9 associated with the integrated circuit 2 can be modified so as to have the connectors 4 on top of the packaging/encapsulation 5 or it may be modified to have the connectors on the radial periphery of the encapsulation/packaging 5, as shown in FIGS. 1 & 2. Moreover, as shown in FIG. 5, connectors 4 can be located both on the radial periphery and on the top of the encapsulation 5 of integrated circuit 2.

This permits the opto-electric device 7 to be positioned such that its leads 6 connect to the connectors 4 and also to leads 3 of the integrated circuit 2 with as short a path as possible. Preferably, the connector 4 is positioned as close to the electronic circuit 1 (e.g., microprocessor, memory or other electronic circuit) as possible such that the leads 6 of the opto-electric device 7 can likewise be closely attached to the circuitry within integrated circuit 2. The leads 3 of the integrated circuit 2 are designed in conjunction with the leads 6 of the opto-electric device 7 such that those leads which are to be connected together are located directly above and below each other, as shown in FIGS. 2 and 6. Depending on the lead frame configurations, IC/OED packages can have single or multiple mounting positions, as shown in FIGS. 4 and 6.

The connectors 4 need only be capable of providing a sufficient surface area to enable electrical contact between opto-electric device leads 6 and the integrated circuit leads 3. Electrical contact can be ensured through the use of balls, pins or any other well known type of electrical connection. Depending on the mode of manufacture, the leads 6 of opto-electric device 7 can be detachably attached to connectors 4, or permanently attached thereto though conventional electrical connection techniques such as vapor-phase soldering.

The connectors 4 provide at a minimum, power and ground connections to the opto-electric device 7, but other connections for transmission and reception of data may also be present.

The present invention overcomes past opto-electric device mounting problems by removing the opto-electric device 7 from the common plane, defined by the integrated circuit 2 on the substrate 8 and placing the opto-electric device 7 in a parallel plane, either above or below the common plane. This permits the integrated circuit 2 and the opto-electric device 7 to be connected through cross-plane connections, shown in FIGS. 2, 6, and 8, that minimize, and unify, electrical wiring pathways delays, reduce EMF and electrical noise, minimize bending of the fiber optic cables 23 and increase board capacity and design options.

The opto-electric device 7 can be mounted on the integrated circuit 2 in several different ways. As shown in FIG. 2, in one embodiment the integrated circuit 2 and the opto-electric device 7 are designed such that connectors 4 of integrated circuit 2 and leads 6 of opto-electric device 7, are located in approximately the same location when the opto-electric device 7 is placed on top of integrated circuit 2. This permits the opto-electric device 7 to be placed in a plane above that of the integrated circuit 2 and mounted to the opto-electric device 7 in a piggy back arrangement. The connections between the opto-electric device 7 and the integrated circuit 2 are made in an inter-plane direction, which can be thought of as the z-axis where the x and y axes define the common plane containing the integrated circuit 2.

When the integrated circuit 2 and the opto-electric device 7 are positioned with their leads in contact with each other, any well known connection device or technique, including but not limited to soldering of one lead directly to another, can be used to couple the opto-electric device 7 to the integrated circuit 2.

The integrated circuit 2 and the opto-electric device 7 do not need to be the same size. Rather, the leads of the integrated circuit 2 and opto-electric device 7 can be designed such that the leads to be connected are above and below each other when the opto-electric device 7 is placed on integrated circuit 2. As noted, the connectors 4 may be located on the radial periphery (e.g. FIGS. 1 & 2) or on top of the encapsulation/packaging 5 of integrated circuit 2 (e.g. FIGS. 3 & 4) or both on the radial periphery and on top of the encapsulation/packaging of the integrated circuit (e.g. FIG. 5).

Figure 7:
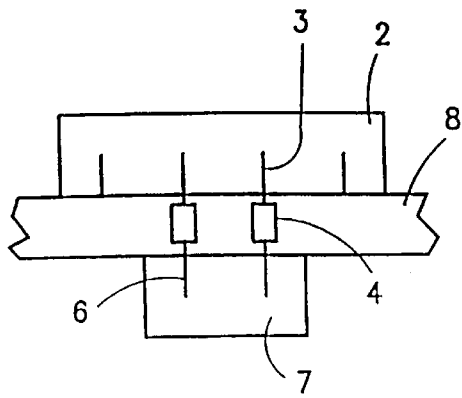
FIG. 7 is an opto-electric device mounted opposite to an integrated circuit on a substrate.

As shown in FIG. 7, in another embodiment, the opto-electric device 7 can be mounted on the opposite side of the substrate 8 from integrated circuit 2. In this position the substrate 8 is designed to facilitate the passage of electrical connectors 4 through it to the opto-electric device 7. The connectors 4 in this case can be formed either completely, or partially, inside the substrate 8 (e.g. FIG. 7) or on either side of the substrate 8.

Figure 8:
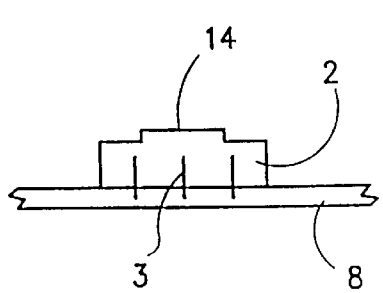
FIG. 8 is a side view of an integrated circuit with a structural support.
Figure 9:
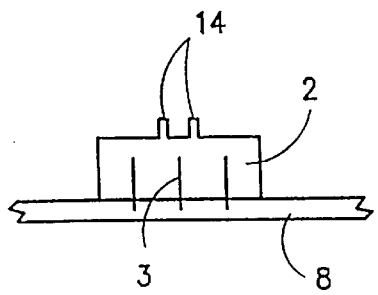
FIG. 9 is a side view of an integrated circuit with locating pins.

As shown in FIGS. 8 and 9, in another embodiment locating pins and/or structural supports 14 are molded into, or attached to the topside of the integrated circuit 2. The locating pins and/or structural support 14 assist in mounting the opto-electric device 7 on top of the integrated circuit 2 as well as assist in minimizing strain associated with this mounting position on the opto-electric device 7.

Figure 10:
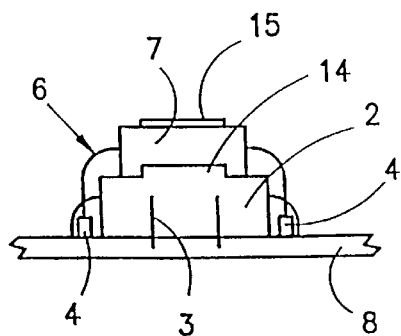
FIG. 10 is a front view of an integrated circuit with a structural support and a heat sink.
Figure 11:
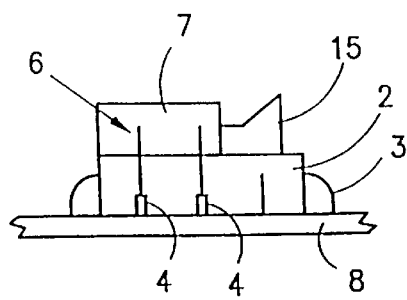
FIG. 11 is a side view of an integrated circuit with a structural support and a heat sink.

In yet another embodiment, as shown in FIGS. 10 and 11, the locating pins and/or structural supports 14 can include a heat sink 15 either integrally formed therein or separately provided. The heat sink can be placed either partially or completely between the integrated circuit 2 and the opto-electric device 7, or not between the integrated circuit 2 and opto-electric device 7 at all.

Figure 12:
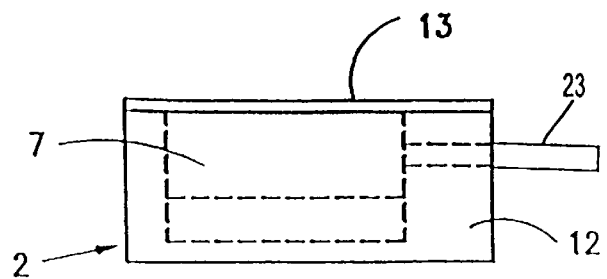
FIG. 12 is a side view of an opto-electric device mounted in a sealed package with the integrated circuit.

FIG. 12 shows another embodiment, which includes a package 12 in which the opto-electric device 7 is formed. The opto-electric device 7 is mounted either on top of or underneath the integrated circuit 2. This package can be made from any well known packaging material, including but not limited to silicon, resin or ceramics. The package can be hermetically or non-hermetically sealed.

One or more sides of the package can incorporate a metallic cover portion 13 which can also function as a heat sink.

Figure 13:
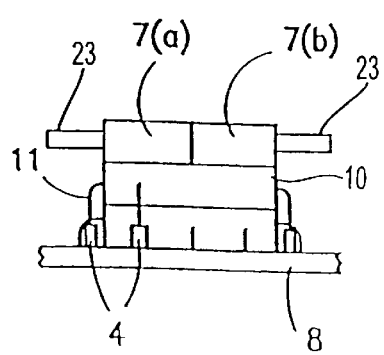
FIG. 13 is a side view of an opto-electric device mounted on an opto-electric device interface mounted on an integrated circuit.
Figure 14:
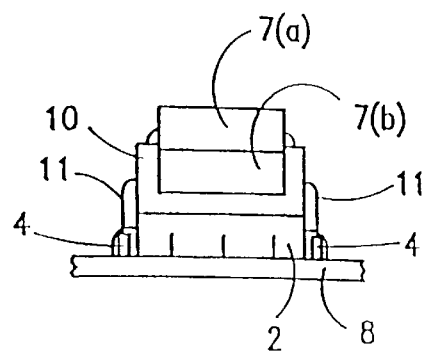
FIG. 14 is a side view of two opto-electric devices mounted one on top of the other with the use of an opto-electric device interface.
Figure 15:
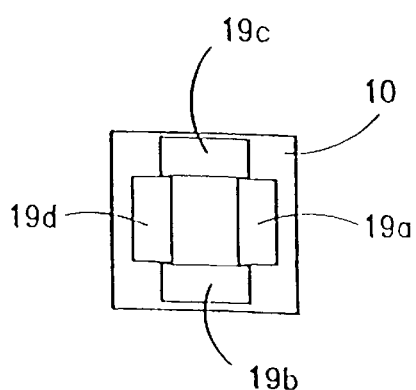
FIG. 15 is a plan view of an opto-electric device interface with multiple opto-electric device interface regions.

FIGS. 13, 14 and 15 show embodiments of the invention in which opto-electric device interface adapter 10 is used for mounting multiple opto-electric devices 7 to an integrated circuit 2 or as a lead connection adapter if the integrated circuit 2 leads 3 and the opto-electric device 7 leads 6 do not provide for easy direct connection. By manipulating the connection of the integrated circuit 2 leads 3 and the opto-electric device 7 leads 6 in the cross-plane direction routing of the electrical connections can be minimized. The opto-electric interface adapter 10 can comprise a lead frame that routes the data transmission/reception leads in the shortest possible distance while routing DC power and ground leads around the data transmission/reception leads.

FIG. 15 illustrates another embodiment of the interface in which the opto-electric device interface adapter 10 is provided with multiple opto-electric device interface regions 19a–d. These opto-electric device interface regions permit an opto-electric device 7 to be mounted in various different positions and/or permits multiple opto-electric devices to be attached to a single integrated circuit 2.

In general, the opto-electric device interface adapter 10 is provided with a set of opto-electric device interface adapter leads 11, as shown in FIG. 14, which connect to the opto-electric device connectors 4. The opto-electric device interface adapter 10 is provided with opto-electric device interface regions which mate to the opto-electric device leads 6. This permits multiple opto-electric device interface regions to be defined, either in the same plane (e.g. FIG. 13) or one on top of the other (e.g. FIG. 14). Multiple opto-electric devices 7(a) and 7(b) can be wired in serial or parallel or independently. Opto-electric device interface regions can be controlled through the integrated circuit 2 or through a separate controller housed in the opto-electric device adapter interface 10 or separately provided on the substrate 8.

The opto-electric device interface adapter 10 is impedance matched to the integrated circuit 2 and the opto-electric device 7 and comprises an internal lead network that is designed to provide the shortest distance between the integrated circuit lead 3 and the opto-electric device lead 6. When multiple leads are being routed 5 it is preferable to house this network in the opto-electric device interface adapter 10 so as to avoid the need to excessively manipulate the leads 6 of the opto-electric device 7.

In addition, the opto-electric device interface adapter 10 can be used to rotate the opto-electric device 7 (e.g. FIGS. 13 and 14) such that the fiber optic cable 23 is positioned in such a manner as to minimize bending, as shown in FIG. 5. Multiple regions can be defined either on the opto-electric device adapter interface 10 or even on the integrated circuit 2, without the use of an opto-electric device adapter interface 10, so as to provide multiple opto-electric device interface regions 9. This permits an opto-electric device 7 to be connected to the interface region 9 that provides the best path for the optical fiber, or high speed communication device being used.

Figure 16:
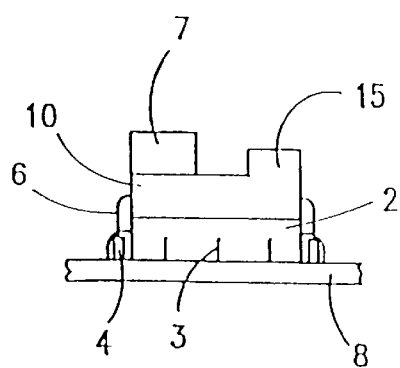
FIG. 16 is a side view of an opto-electric device mounted on an opto-electric device interface with a heat sink mounted on an integrated circuit.

As shown in FIG. 16, the opto-electric device interface 10 can also incorporate a heat sink 15 to reduce any heat buildup associated with mounting of an opto-electric device 7 on top of the integrated circuit 2 or from the integrated circuit 2 itself.

Figure 17:
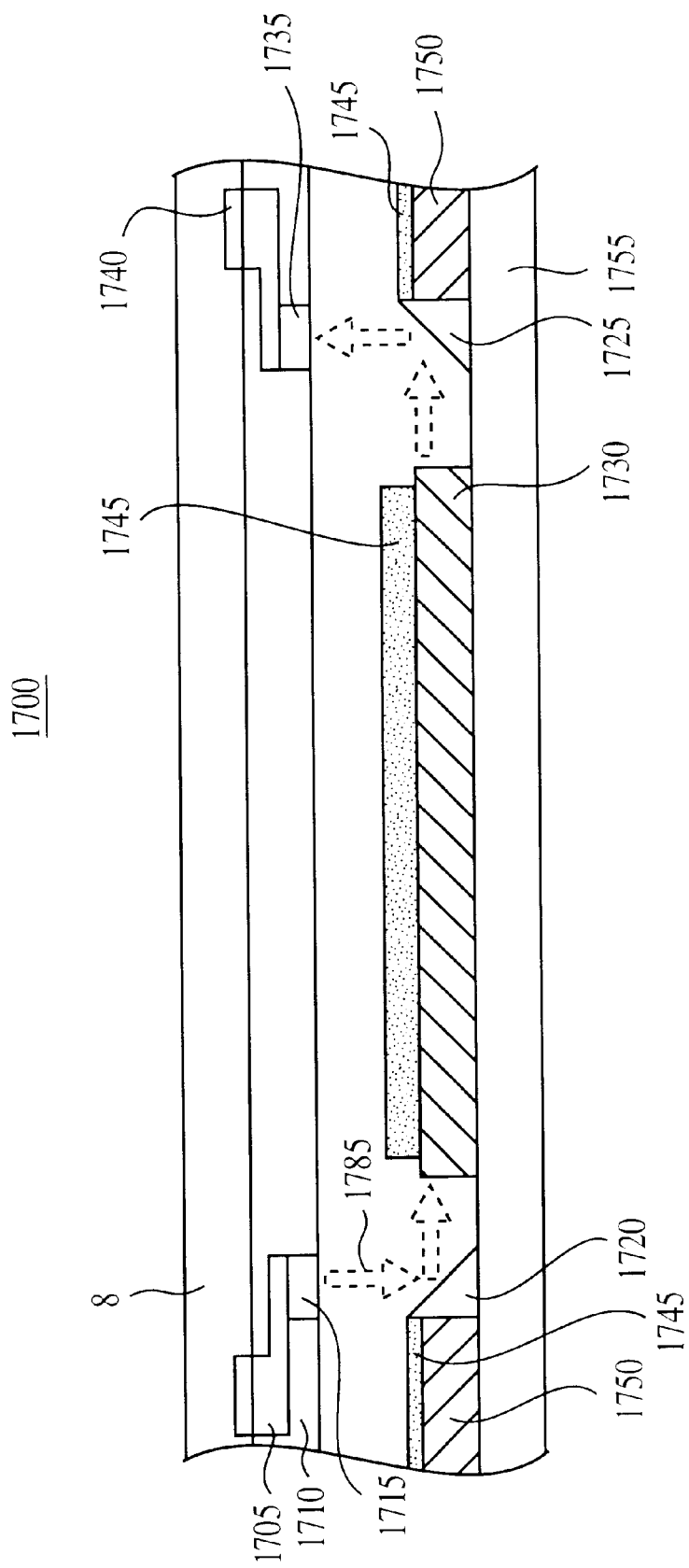
FIG. 17 is a side view of a substrate with a first exemplary light transmission system.

Turning now to FIG. 17, a side view of a substrate (e.g., wafer) 1755 with a first exemplary light transmission system 1700 is depicted. Light transmission system 1700 provides for on-substrate transmission of an optical signal that corresponds to the optical signal being carried by the fiber optic cable (e.g., 23 of FIG. 2) and that is transformed into an electrical signal by the opto-electric device (e.g., 7 of FIG. 2).

Circuit substrate 8, such as that depicted in FIGS. 2, 6–11, 13, 14 and 16, contains a portion of a metal pad 1705 which is in turn coupled to a laser device 1715 (e.g., a vertical cavity surface emitting laser (VCSEL), or any other suitable laser device). As depicted, a portion of metal pad 1705 and laser device 1715 are included within an active circuitry portion 1710 of the system. The active circuitry portion 1710 may include any other active circuitry such as, for example, memory devices, ASICs, processors, etc.

Metal pad 1705 receives the electrical signal output by the opto-electric device 7 (not shown for simplicity) and inputs the signal into the laser device 1715. Laser device 1715 converts the electrical signal into an optical signal 1785 and transmits the optical signal 1785 to a mirror 1720 located on the wafer substrate 1755. The mirror 1720 reflects the optical signal 1785 to the input of a fiber channel 1730 situated on the wafer substrate 1755.

At the other end of fiber channel 1730, the optical signal 1785 is reflected by mirror 1725 to the input of a photo receptor 1735 that transforms the optical signal 1785 back into an electrical signal and forwards the electrical signal to metal pad 1740 for further processing. As depicted in FIG. 17, both mirrors 1720, 1725 and the fiber channel 1730 are coated with surface protection 1745. The left side of mirror 1720, as well as the right side of mirror 1725 are respective isolation regions 1750.

Figure 18:
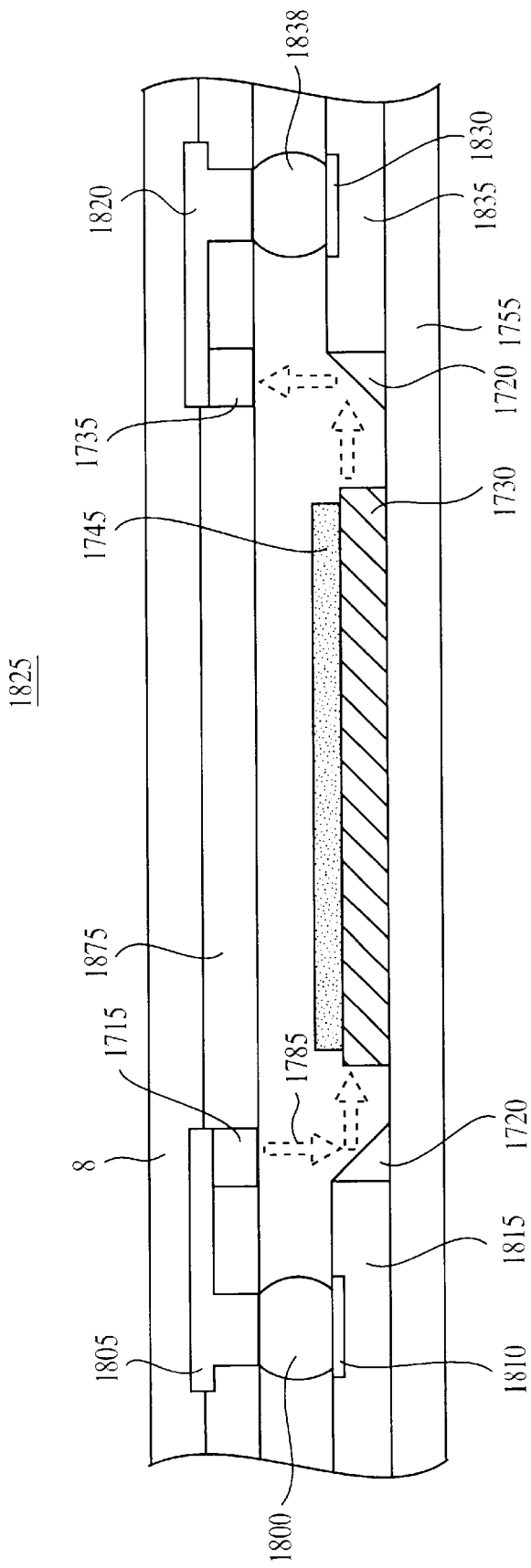
FIG. 18 is a side view of a substrate with a second exemplary light transmission system.

Turning now to FIG. 18, a side view of a wafer substrate 1755 with a second exemplary light transmission system 1825 is depicted. Similarly to the system 1700 of FIG. 17, the FIG. 18 system 1825 depicts a circuit substrate 8, such as that depicted in FIGS. 2, 6–11, 13, 14 and 16, that contains a portion of a metal pad 1805 which is coupled to a laser device (e.g., a VCSEL) 1715. As depicted, a portion of metal pad 1805 and laser device 1715 are included within an insulation portion 1875 of the system 1825 that does not contain active circuitry.

Active circuitry portion 1815 receives an electrical signal which may be, or be based on, the electrical signal transmitted by the opto-electric device 7 (not shown for simplicity). The electrical signal is passed through metal pad 1810 and through the electro-mechanical interconnect 1800 to the metal pad 1805 located on the (upper) insulation portion 1875 of the system 1825. Metal pad 1805 receives the electrical signal and passes the signal to the laser device 1715. Laser device 1715 converts the electrical signal into an optical signal 1785 and transmits the optical signal 1785 to a mirror 1720 located on the wafer substrate 1755. The mirror 1720 reflects the optical signal 1785 to the input of a fiber channel 1730 situated on the wafer substrate 1755.

At the other end of fiber channel 1730, the optical signal is reflected by a mirror 1730 to the input of a photo receptor 1735 that transforms the optical signal 1785 back into an electrical signal and forwards the electrical signal to metal pad 1820. Metal pad 1820 then forwards the electrical signal to the electro-mechanical interconnect 1838 which passes the electrical signal back down to the (lower) active circuitry portion 1835 for further processing. The fiber channel 1730 is coated with surface protection 1745. As described above, unlike FIG. 17, the left side of mirror 1720, as well as the right side of mirror 1725 are respective active circuitry portions 1815, 1835.

Figure 19:
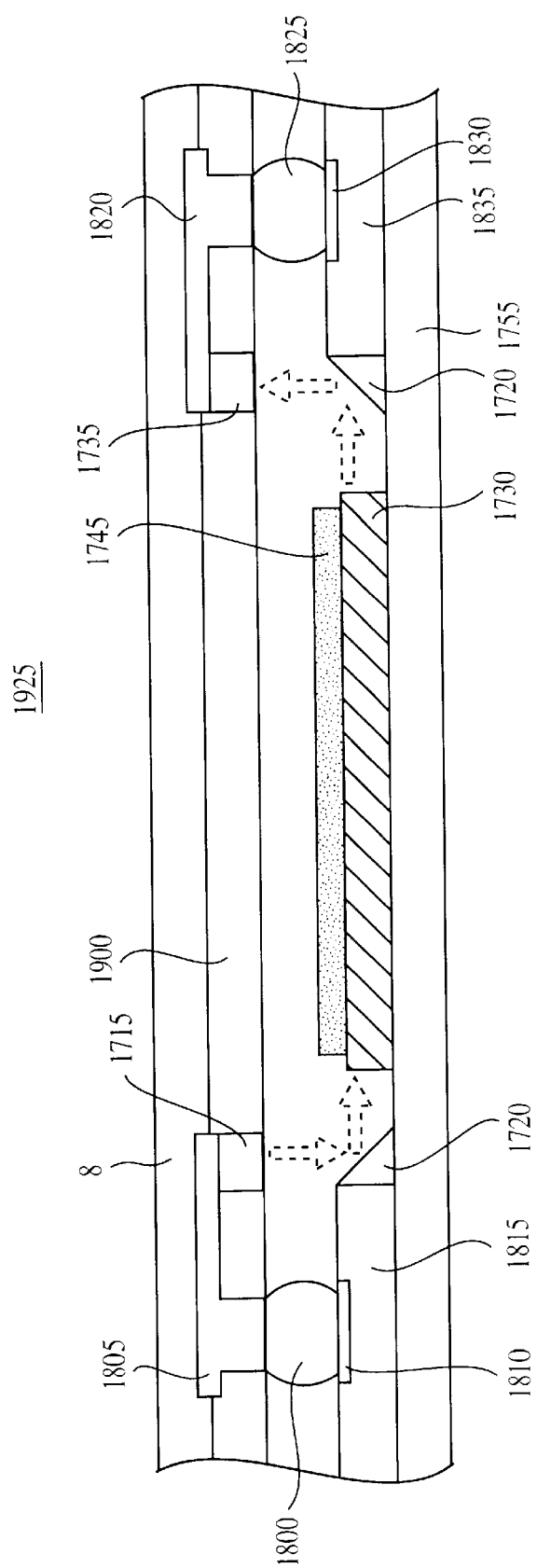
FIG. 19 is a side view of a substrate with a third exemplary light transmission system.

Turning to FIG. 19, a side view of a wafer substrate 1755 with a third exemplary light transmission system 1925 is depicted. The third light transmission system 1925 is identical to the second light transmission system 1825 (of FIG. 18) except that the region that includes the metal pads 1805, 1820 and the laser device 1715 and the photo receptor 1735 is an active circuitry region 1900. Accordingly, active circuitry region may contain any active circuitry such as, for example, memory devices, ASICs, processors, etc. Further, active circuitry region 1900 faces active circuitry regions 1815 and 1835 which may offer certain cross-plane advantages to the user.

The invention is not limited to the exemplary embodiment which are described above as many changes and modifications may be made without departing from the spirit and scope of the present invention. Accordingly the invention is not depicted to the specific embodiments as described above, but is only limited by the scope of the attached claims.

What is claimed as new and desired to be protected by Letters Patent of the United States is:

1. A substrate, comprising:
   a laser device for receiving a first electrical signal and transmitting a first optical signal based on said first electrical signal;
   a fiber channel on said substrate configured to receive said first optical signal at a first location on said substrate and to pass said first optical signal to a second location on said substrate; and
   a photo receptor for receiving said first optical signal passed by said fiber channel and transmitting a second electrical signal based on said first optical signal.

2. The substrate of claim 1 further comprising:
   a mirror coupled between said laser device and said fiber channel for reflecting said first optical signal to said fiber channel at said first location.

3. The substrate of claim 1 further comprising:
   a mirror coupled between said fiber channel and said photo receptor for reflecting said first optical signal to said photo receptor at said second location.

4. The substrate of claim 1 further comprising:
   an opto-electric device coupled to an input of said laser device for transmitting said first electrical signal to said laser device.

5. The substrate of claim 4, wherein an input of said opto-electric device is coupled to a fiber optic cable for receiving a second optical signal.

6. The substrate of claim 4 further comprising:
   a metal pad coupled between said opto-electric device and said input of said laser device for passing said first electrical signal to said laser device.

7. The substrate of claim 1, wherein said laser device comprises a vertical cavity surface emitting laser.

8. The substrate of claim 1 further comprising:
   a metal pad coupled to an output of said photo receptor for passing said second electrical signal.

9. The substrate of claim 2, wherein said laser device and said fiber channel are on different planes of said substrate.

10. The substrate of claim 9, wherein said mirror and said fiber channel are on a first plane, and wherein said laser device is on a second plane of said substrate.

11. The substrate of claim 9 further comprising:
a first metal pad on said second plane coupled to said laser device for passing said first electrical signal to said laser device;
a vertically disposed interconnect coupling said first metal pad to a second metal pad on said first plane, said second metal pad, said interconnect and said first metal pad passing said first electrical signal to said laser device.

12. The substrate of claim 3, wherein said photo receptor and said fiber channel are on different planes of said substrate.

13. The substrate of claim 12, wherein said mirror and said fiber channel are on a first plane, and wherein said photo receptor is on a second plane.

14. The substrate of claim 13 further comprising:
a first metal pad on said second plane coupled to said photo receptor for passing said second electrical signal received from said photo receptor;
a vertically disposed interconnect coupling said first metal pad to a second metal pad on said first plane, said second metal pad, said interconnect and said first metal pad passing said second electrical signal.

15. A method for transmitting a signal, the method comprising:
receiving a first electrical signal at a laser device and transmitting a first optical signal based on said first electrical signal;
receiving said first optical signal at a first location on said substrate;
passing said first optical signal to a second location on said substrate; and
receiving said first optical signal at a photo receptor and transmitting a second electrical signal based on said first optical signal.

16. The method of claim 15, wherein said act of receiving a first electrical signal comprises:
receiving a second optical signal at an opto-electric device; and
transmitting said first electrical signal based on said second optical signal to said laser device.

17. The method of claim 15, wherein said act of receiving said first optical signal at a first location comprises:
receiving said first optical signal at a mirror; and
reflecting said first optical signal to an input of a fiber channel at said first location.

18. The method of claim 15, wherein said act of passing comprises:
receiving said first optical signal at an input of a fiber channel on said substrate; and
passing said first optical signal to said second location via said fiber channel.

19. The method of claim 15, wherein said act of receiving said first optical signal at a photo receptor comprises:
receiving said first optical signal at a mirror; and
reflecting said first optical signal to an input of said photo receptor at said second location.

20. A semiconductor chip, comprising:
a laser device for receiving a first electrical signal and transmitting a first optical signal based on said first electrical signal;
a fiber channel on said chip configured to receive said first optical signal at a first location on said chip and to pass said first optical signal to a second location on said chip; and
a photo receptor for receiving said first optical signal passed by said fiber channel and transmitting a second electrical signal based on said first optical signal.

21. The semiconductor chip of claim 20 further comprising:
a mirror coupled between said laser device and said fiber channel for reflecting said first optical signal to said fiber channel at said first location.

22. The semiconductor chip of claim 20 further comprising:
a mirror coupled between said fiber channel and said photo receptor for reflecting said first optical signal to said photo receptor at said second location.

23. The semiconductor chip of claim 20 further comprising:
an opto-electric device coupled to an input of said laser device for transmitting said first electrical signal to said laser device.

24. The semiconductor chip of claim 23, wherein an input of said opto-electric device is coupled to a fiber optic cable for receiving a second optical signal.

25. The semiconductor chip of claim 23 further comprising:
a metal pad coupled between said opto-electric device and said input of said laser device for passing said first electrical signal to said laser device.

26. The semiconductor chip of claim 20, wherein said laser device comprises a vertical cavity surface emitting laser.

27. The semiconductor chip of claim 20 further comprising:
a metal pad coupled to an output of said photo receptor for passing said second electrical signal.

28. The semiconductor chip of claim 21, wherein said laser device and said fiber channel are on different planes of said chip.

29. The semiconductor chip of claim 28, wherein said mirror and said fiber channel are on a first plane, and wherein said laser device is on a second plane of said chip.

30. The semiconductor chip of claim 28 further comprising:
a first metal pad on said second plane coupled to said laser device for passing said first electrical signal to said laser device;
a vertically disposed interconnect coupling said first metal pad to a second metal pad on said first plane, said second metal pad, said interconnect and said first metal pad passing said first electrical signal to said laser device.

31. The semiconductor chip of claim 22, wherein said photo receptor and said fiber channel are on different planes of said chip.

32. The semiconductor chip of claim 31, wherein said mirror and said fiber channel are on a first plane, and wherein said photo receptor is on a second plane.

33. The semiconductor chip of claim 32 further comprising:
a first metal pad on said second plane coupled to said photo receptor for passing said second electrical signal received from said photo receptor;
a vertically disposed interconnect coupling said first metal pad to a second metal pad on said first plane, said second metal pad, said interconnect and said first metal pad passing said second electrical signal.

* * * * *